United States Patent
Maloney

(10) Patent No.: US 9,858,073 B2
(45) Date of Patent: Jan. 2, 2018

(54) PROCESSOR

(75) Inventor: David Maloney, Dublin (IE)

(73) Assignee: LINEAR ALGEBRA TECHNOLOGIES LIMITED, Dublin (IE)

( * ) Notice: Subject to any disclaimer, the term of this patent is extended or adjusted under 35 U.S.C. 154(b) by 1169 days.

(21) Appl. No.: 12/867,095

(22) PCT Filed: Feb. 11, 2009

(86) PCT No.: PCT/EP2009/051598
§ 371 (c)(1),
(2), (4) Date: Oct. 20, 2010

(87) PCT Pub. No.: WO2009/101119
PCT Pub. Date: Aug. 20, 2009

(65) Prior Publication Data
US 2011/0047360 A1 Feb. 24, 2011

(30) Foreign Application Priority Data
Feb. 11, 2008 (GB) .................. 0802484.6

(51) Int. Cl.
| | | |
|---|---|---|
| G06F 9/00 | (2006.01) | |
| G06F 12/00 | (2006.01) | |
| G06F 9/30 | (2006.01) | |
| G06F 9/38 | (2006.01) | |
| G06F 12/02 | (2006.01) | |
| H03M 7/30 | (2006.01) | |

(52) U.S. Cl.
CPC ........ *G06F 9/30043* (2013.01); *G06F 9/3824* (2013.01); *G06F 12/02* (2013.01); *H03M 7/3066* (2013.01); *G06F 2212/401* (2013.01)

(58) Field of Classification Search
None
See application file for complete search history.

(56) References Cited

U.S. PATENT DOCUMENTS

| | | |
|---|---|---|
| 4,125,873 A | 11/1978 | Chesarek |
| 4,606,002 A | 8/1986 | Waisman et al. |
| 5,153,591 A | 10/1992 | Clark |
| 5,247,638 A | 9/1993 | O'Brien et al. |
| 5,394,534 A | 2/1995 | Kulakowski et al. |
| 5,805,735 A | 9/1998 | Chen et al. |
| 5,960,465 A | 9/1999 | Adams |
| 6,145,069 A | 11/2000 | Dye |

(Continued)

FOREIGN PATENT DOCUMENTS

| | | |
|---|---|---|
| CA | 2564844 | 11/2005 |
| GB | 2447494 A | 9/2008 |
| WO | 0143074 A1 | 6/2001 |

OTHER PUBLICATIONS

Application No. GB0704976.0, Patents Act 1977: Search Report under Section 17, Date of search: Jul. 26, 2007.

(Continued)

*Primary Examiner* — David X Yi
*Assistant Examiner* — Craig Goldschmidt
(74) *Attorney, Agent, or Firm* — Hanley, Flight and Zimmerman, LLC

(57) ABSTRACT

The present application provides a method of randomly accessing a compressed structure in memory without the need for retrieving and decompressing the entire compressed structure.

22 Claims, 20 Drawing Sheets

(56) References Cited

U.S. PATENT DOCUMENTS

| | | |
|---|---|---|
| 6,243,081 B1 | 6/2001 | Goris et al. |
| 6,564,305 B1 * | 5/2003 | Moore .......................... 711/154 |
| 6,591,019 B1 * | 7/2003 | Comair et al. ................ 382/248 |
| 2007/0112795 A1 * | 5/2007 | Travison et al. ............. 707/100 |

OTHER PUBLICATIONS

International Search Report, International Application No. PCT/EP2009/051598, dated Jun. 4, 2009.
Abadi et al. "Integrating Compression and Execution in Column-Oriented Database Systems." 2006, 12 pages.

* cited by examiner $$S(s_x, s_y, s_z) = \begin{bmatrix} s_x & 0 & 0 & 0 \\ 0 & s_y & 0 & 0 \\ 0 & 0 & s_z & 0 \\ 0 & 0 & 0 & 1 \end{bmatrix}$$

Scaling matrix $$T(d_x, d_y, d_z) = \begin{bmatrix} 1 & 0 & 0 & d_x \\ 0 & 1 & 0 & d_y \\ 0 & 0 & 1 & d_z \\ 0 & 0 & 0 & 1 \end{bmatrix}$$

translation matrix $$R_x(\theta) = \begin{bmatrix} 1 & 0 & 0 & 0 \\ 0 & \cos\theta & -\sin\theta & 0 \\ 0 & \sin\theta & \cos\theta & 0 \\ 0 & 0 & 0 & 1 \end{bmatrix}$$

x-axis rotation matrix $$R_y(\theta) = \begin{bmatrix} \cos\theta & 0 & \sin\theta & 0 \\ 0 & 1 & 0 & 0 \\ -\sin\theta & 0 & \cos\theta & 0 \\ 0 & 0 & 0 & 1 \end{bmatrix}$$

y-axis rotation matrix $$R_z(\theta) = \begin{bmatrix} \cos\theta & -\sin\theta & 0 & 0 \\ \sin\theta & \cos\theta & 0 & 0 \\ 0 & 0 & 1 & 0 \\ 0 & 0 & 0 & 1 \end{bmatrix}$$

z-axis rotation matrix $$SH_{xy}(sh_x, sh_y) = \begin{bmatrix} 1 & 0 & sh_x & 0 \\ 0 & 1 & sh_y & 0 \\ 0 & 0 & 1 & 0 \\ 0 & 0 & 0 & 1 \end{bmatrix}$$

xy shear matrix $$SH_{xz}(sh_x, sh_z) = \begin{bmatrix} 1 & sh_x & 0 & 0 \\ 0 & 1 & 0 & 0 \\ 0 & sh_z & 1 & 0 \\ 0 & 0 & 0 & 1 \end{bmatrix}$$

xz shear matrix $$SH_{yz}(sh_y, sh_z) = \begin{bmatrix} 1 & 0 & 0 & 0 \\ sh_y & 1 & 0 & 0 \\ sh_z & 0 & 1 & 0 \\ 0 & 0 & 0 & 1 \end{bmatrix}$$

yz shear matrix

Figure 2

4x4 matrix data

|   | 0 | 1 | 2 | 3 |
|---|---|---|---|---|
|   | 1.0 | 2.0 | 3.0 | 4.0 |
|   | 0.0 | 6.0 | 0.0 | 0.0 |
|   | 0.0 | 0.0 | 0.0 | 12.0 |
|   | 13.0 | 14.0 | 0.0 | 16.0 | bitmap

| 1 | 1 | 1 | 1 |
|---|---|---|---|
| 0 | 1 | 0 | 0 |
| 0 | 0 | 0 | 1 |
| 1 | 1 | 0 | 1 |

*16 bits stored as 32-bit entry*

|  | IEEE prec. | storage bits |
|---|---|---|
| original data with fill | 32 | 128 |
|  | 32 | 128 |
|  | 32 | 128 |
|  | 32 | 128 |
| total |  | 512 |

|  | IEEE prec. | storage bits |
|---|---|---|
| compressed with bitmap | 32 | 128 |
|  | 32 | 32 |
|  | 32 | 32 |
|  | 32 | 96 |
| total |  | 320 |

| compression | 37.5% |
|---|---| uncomp. memory

| 1.0 |
|---|
| 2.0 |
| 3.0 |
| 4.0 |
| 0.0 |
| 6.0 |
| 0.0 |
| 0.0 |
| 0.0 |
| 0.0 |
| 12.0 |
| 13.0 |
| 14.0 |
| 0.0 |
| 16.0 |

16x32 comp. memory

| 1.0 |
|---|
| 2.0 |
| 3.0 |
| 4.0 |
| 6.0 |
| 12.0 |
| 13.0 |
| 14.0 |
| 16.0 |
| 1111010000011101 |

| f7 | f6 | f5 | f4 | f3 | f2 | f1 | f0 | fen[2:0] sequence | | | | | | |
|---|---|---|---|---|---|---|---|---|---|---|---|---|---|---|
| 0 | 0 | 0 | 0 | 0 | 0 | 0 | 0 | | | | | | | |
| 0 | 0 | 0 | 0 | 0 | 0 | 0 | 1 | 0 | | | | | | |
| 0 | 0 | 0 | 0 | 0 | 0 | 1 | 0 | 1 | | | | | | |
| 0 | 0 | 0 | 0 | 0 | 0 | 1 | 1 | 0 | 1 | | | | | |
| 0 | 0 | 0 | 0 | 0 | 1 | 0 | 0 | 2 | | | | | | |
| 0 | 0 | 0 | 0 | 0 | 1 | 0 | 1 | 0 | 2 | | | | | |
| 0 | 0 | 0 | 0 | 0 | 1 | 1 | 0 | 1 | 2 | | | | | |
| 0 | 0 | 0 | 0 | 0 | 1 | 1 | 1 | 0 | 1 | 2 | | | | |
| 0 | 0 | 0 | 0 | 1 | 0 | 0 | 0 | 3 | | | | | | |
| 0 | 0 | 0 | 0 | 1 | 0 | 0 | 1 | 0 | 3 | | | | | |
| 0 | 0 | 0 | 0 | 1 | 0 | 1 | 0 | 1 | 3 | | | | | |
| 0 | 0 | 0 | 0 | 1 | 0 | 1 | 1 | 0 | 1 | 3 | | | | |
| 0 | 0 | 0 | 0 | 1 | 1 | 0 | 0 | 2 | 3 | | | | | |
| 0 | 0 | 0 | 0 | 1 | 1 | 0 | 1 | 0 | 2 | 3 | | | | |
| 0 | 0 | 0 | 0 | 1 | 1 | 1 | 0 | 1 | 2 | 3 | | | | |
| 0 | 0 | 0 | 0 | 1 | 1 | 1 | 1 | 0 | 1 | 2 | 3 | | | |
| 0 | 0 | 0 | 1 | 0 | 0 | 0 | 0 | 4 | | | | | | |
| 0 | 0 | 0 | 1 | 0 | 0 | 0 | 1 | 0 | 4 | | | | | |
| 0 | 0 | 0 | 1 | 0 | 0 | 1 | 0 | 1 | 4 | | | | | |
| 0 | 0 | 0 | 1 | 0 | 0 | 1 | 1 | 0 | 1 | 4 | | | | |
| 0 | 0 | 0 | 1 | 0 | 1 | 0 | 0 | 2 | 4 | | | | | |
| 0 | 0 | 0 | 1 | 0 | 1 | 0 | 1 | 0 | 2 | 4 | | | | |
| 0 | 0 | 0 | 1 | 0 | 1 | 1 | 0 | 1 | 2 | 4 | | | | |
| 0 | 0 | 0 | 1 | 0 | 1 | 1 | 1 | 0 | 1 | 2 | 4 | | | |
| 0 | 0 | 0 | 1 | 1 | 0 | 0 | 0 | 3 | 4 | | | | | |
| 0 | 0 | 0 | 1 | 1 | 0 | 0 | 1 | 0 | 3 | 4 | | | | |
| 0 | 0 | 0 | 1 | 1 | 0 | 1 | 0 | 1 | 3 | 4 | | | | |
| 0 | 0 | 0 | 1 | 1 | 0 | 1 | 1 | 0 | 1 | 3 | 4 | | | |
| 0 | 0 | 0 | 1 | 1 | 1 | 0 | 0 | 2 | 3 | 4 | | | | |
| 0 | 0 | 0 | 1 | 1 | 1 | 0 | 1 | 0 | 2 | 3 | 4 | | | |
| 0 | 0 | 0 | 1 | 1 | 1 | 1 | 0 | 1 | 2 | 3 | 4 | | | |
| 0 | 0 | 0 | 1 | 1 | 1 | 1 | 1 | 0 | 1 | 2 | 3 | 4 | | |
| 1 | 1 | 1 | 1 | 1 | 0 | 0 | 0 | 3 | 4 | 5 | 6 | 7 | | |
| 1 | 1 | 1 | 1 | 1 | 0 | 0 | 1 | 0 | 3 | 4 | 5 | 6 | 7 | |
| 1 | 1 | 1 | 1 | 1 | 0 | 1 | 0 | 1 | 3 | 4 | 5 | 6 | 7 | |
| 1 | 1 | 1 | 1 | 1 | 0 | 1 | 1 | 0 | 1 | 3 | 4 | 5 | 6 | 7 |
| 1 | 1 | 1 | 1 | 1 | 1 | 0 | 0 | 2 | 3 | 4 | 5 | 6 | 7 | |
| 1 | 1 | 1 | 1 | 1 | 1 | 0 | 1 | 0 | 2 | 3 | 4 | 5 | 6 | 7 |
| 1 | 1 | 1 | 1 | 1 | 1 | 1 | 0 | 1 | 2 | 3 | 4 | 5 | 6 | 7 |
| 1 | 1 | 1 | 1 | 1 | 1 | 1 | 1 | 0 | 1 | 2 | 3 | 4 | 5 | 6 | 7 |

Figure 11

| bits | PEU | BRU | LSU1 | LSU2 | VAU<br>IAU1 | SAU<br>IAU0 | CMU |
|------|-----|-----|------|------|------|------|-----|
| 127  | 9   | 11  | 24   | 24   | 22   | 21   | 16  |

Figure 14

| | op | | dst | base | index | | offset | | | | | |
|---|---|---|---|---|---|---|---|---|---|---|---|---|
| 24 23 | 22 | 21 | 20 19 18 17 | 16 15 14 13 | 12 11 10 | 9 | 8 | 7 | 6 | 5 | 4 | 3 2 1 |
| | | | | | LSU | | | | | | | |
| NOP | 0 | 0 | x | x | x | | x | | | | | |
| LDXV | 0 | 1 | vrf | irf(base|inc) | irf | fp | | iop | | | 6-bit imm (signed) | |
| STXV | 1 | 0 | vrf | irf(base|inc) | irf | fp | | iop | | | 6-bit imm (signed) | |
| LDCV | 1 | 1 | vrf | irf(base|inc) | irf(bitmap) | fp | f7 | f6 | f5 | f4 | f3 | f2 f1 f0 |
| STCV | 0 | 1 | vrf | irf(base|inc) | irf(bitmap) | fp | f7 | f6 | f5 | f4 | f3 | f2 f1 f0 |
| LDLI | 0 | 1 | irf | 16 bit imm | | | | | | | | |
| LDHI | 1 | 0 | irf | 16 bit imm | | | | | | | | |
| LDHF | 1 | 1 | vrf/irf | irf(base|inc) | | | 0 | 0 | dst | fp | iop | x |

Figure 15

| matrix | upper 16 bits are unused 0x000 | | | | | | | | | | | | | | | | nz | comp % |
|---|---|---|---|---|---|---|---|---|---|---|---|---|---|---|---|---|---|---|
| scaling | 1 | 0 | 0 | 0 | 0 | 1 | 0 | 0 | 0 | 0 | 1 | 0 | 0 | 0 | 0 | 1 | 4 | 68.8% |
| translation | 1 | 0 | 0 | 1 | 0 | 1 | 0 | 1 | 0 | 0 | 1 | 1 | 0 | 0 | 0 | 1 | 7 | 50.0% |
| x-axis rot. | 1 | 0 | 0 | 0 | 0 | 1 | 1 | 0 | 0 | 1 | 1 | 0 | 0 | 0 | 0 | 1 | 6 | 56.3% |
| y-axis rot. | 1 | 0 | 1 | 0 | 0 | 1 | 0 | 0 | 1 | 0 | 1 | 0 | 0 | 0 | 0 | 1 | 6 | 56.3% |
| z-axis rot. | 1 | 1 | 0 | 0 | 1 | 1 | 0 | 0 | 0 | 0 | 1 | 0 | 0 | 0 | 0 | 1 | 6 | 56.3% |
| xy shear | 1 | 0 | 1 | 0 | 0 | 1 | 1 | 0 | 0 | 0 | 1 | 0 | 0 | 0 | 0 | 1 | 6 | 56.3% |
| xz shear | 1 | 1 | 0 | 0 | 0 | 1 | 0 | 0 | 0 | 1 | 1 | 0 | 0 | 0 | 0 | 1 | 6 | 56.3% |
| yz shear | 1 | 0 | 0 | 0 | 1 | 1 | 0 | 0 | 1 | 0 | 1 | 0 | 0 | 0 | 0 | 1 | 6 | 56.3% |

Figure 18

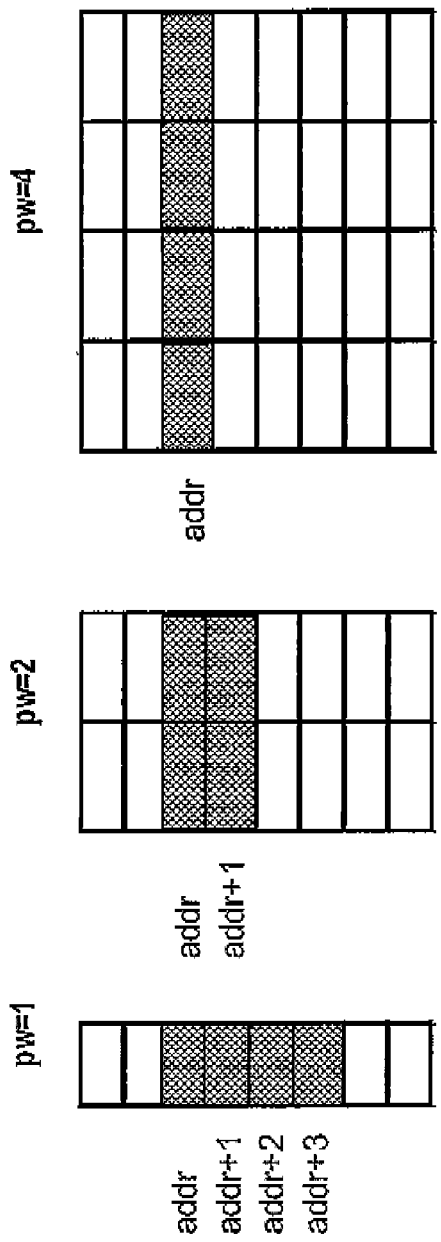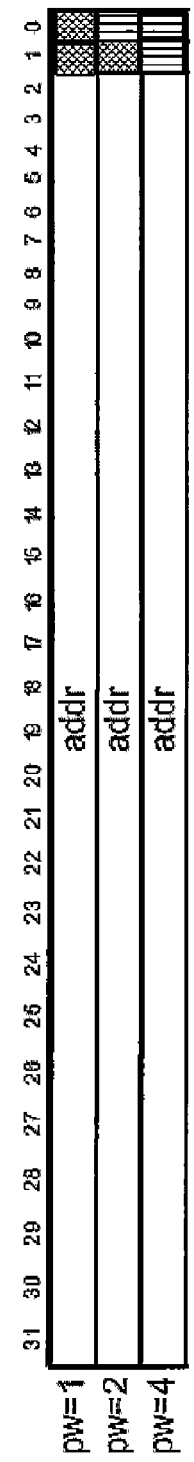

PROCESSOR

RELATED APPLICATIONS

This application is a national phase of PCT Application No. PCT/EP2009/051598, filed Feb. 11, 2009, entitled, "A PROCESSOR," which is hereby incorporated by reference into this application.

FIELD OF THE APPLICATION

The present application relates to the field of processors and to methods of transferring data between memory and the processor. More particularly, the present application is directed to a method of accessing an individual value, or contiguous or non-contiguous group of values within a compressed data-structure in memory without the need for retrieving and decompressing the entire compressed structure.

BACKGROUND OF THE APPLICATION

There is a fundamental problem in the design of computing systems, namely that of minimising the time cost of memory accesses.

This is a fundamental limitation on the design of computer systems as no matter what memory technology is used to support computation and no matter what technology is used to connect that memory to the processor, there is a maximum limitation on how much information can be transferred between processor and memory in a given time, this is the available memory bandwidth and the limitation of computer power by available memory bandwidth is often referred to as the "memory-wall".

The present application seeks to increase the effective memory bandwidth and thus minimise the limitation of the "memory-wall" through the use of data compression.

It is known to employ data compression to reduce the effects of the "memory wall". However, a problem for programmers using compressed memory sub-systems is that data has to be decompressed before it can be operated upon as shown in the system of FIG. 1. This usually involves reading the compressed data from one part of memory 10 into the register files of the processor 16, decompressing it using program code retrieved from program memory 18 and storing the decompressed data in another uncompressed portion of memory 12.

However this solution has the disadvantage that additional memory bandwidth is required to read compressed data, store it in uncompressed form, and read it back into the processor to be operated upon. Additional memory capacity is also required to hold the uncompressed data and the decompression process will increase pressure on the processors register-files. Clearly this is a sub-optimal solution which it is suggested explains why such compressed memory sub-systems have remained an academic curiosity rather than entering the mainstream microprocessor industry.

EP-0240032-A2 discloses a vector processor comprises a memory for storing and retrieving vector data. The vector processor comprises a plurality of vector registers each capable of reading or writing plural (m) vector elements in parallel, at least one mask vector register capable of m mask bits in parallel, transfer portion connected to the memory, the plurality of vector registers and the mask vector register and responsive to an instruction for transferring vector elements from regularly spaced address locations within the memory to selected storage locations of a selected vector register corresponding to valid mask bits. Whilst this approach is useful, it is limited in that the storage\retrieval of vector data is limited to an entire register.

Register-blocking is a useful technique for accelerating matrix algebra (particularly Finite-Element), however it has the disadvantage in that for many matrices (ex. As used in search engines such as GOOGLE™) zero fill has to be added decreasing effective FLOPS (Floating Point Operations Per Second), and increasing memory bandwidth requirements, both of which are commodities which are in short supply in modern computing systems.

In fact the growing gap between processing capabilities and memory bandwidth which are increasing at highly disparate rates of 50% and 7% per annum respectively is referred to, as mentioned above, as the "Memory Wall". There have been many claims of "breaking" the memory wall and they usually consist of using a cache to reduce the probability of having to go off-chip, and/or using multi-threading so that the latency and penalties associated with going off-chip can be mitigated.

These approaches merely hide the problem of limited external memory bandwidth rather than solving it and generally rely on the data-set exhibiting sufficient data locality, and/or the program exhibiting sufficient Thread-Level Parallelism (TLP) in order to be effective at all, and this may not be true of all problems, and is certainly not always known a priori. In fact many of the larger and more interesting problems exhibit neither sufficient data-locality, nor sufficient TLP and the throughput of the whole system degenerates to the point where it is limited by external memory bandwidth, and the extra hardware which has been added on-chip is of no use. For this reason it is not uncommon to see large engineering applications pulling down processor performance to 1% or less of the manufacturers quoted peak performance specification.

SUMMARY

The present application seeks to increase the effective memory bandwidth and minimise the limitation of the "memory-wall" on computation by storing data in a compressed format. This is achieved by providing a means of compression and decompression which is suitable for block-structured data used in many applications including, for example, computer graphics, rigid-body dynamics, finite-element analysis and other scientific and engineering applications, which operate on large data sets which must be stored in memory. In order to further reduce the effect of the "memory-wall", the processor pipeline is also modified in such a way as to take advantage of compression, increasing the processing rate beyond what can be achieved by operating on compressed data alone.

More particularly, the present application allows random-access to individual values within a compressed structure stored in memory through the use of a value map and associated field bits specified as part of an instruction.

BRIEF DESCRIPTION OF THE DRAWINGS

The present application will now be described with reference to the accompanying drawings in which:

FIG. 2 is a series of transformations for which the processor of the present application is suitable for processing, FIG. 4 illustrates a exemplary compression method that may be employed by the processor of FIG. 3, FIG. 11 is an illustration of address sequence generation for use in FIG. 10.

FIG. 14 is an instruction format,

FIG. 15 is a table showing various opcode instructions available in an exemplary processor including instructions for loading\storing compressed data, FIG. 18 illustrates the computational savings that may provided by the exemplary processor of FIG. 3 for different types of matrix structure, FIG. 20 illustrates the effects of port width on memory organisation, FIG. 21 illustrates the resulting effect on address generation for the addresses shown in FIG. 20.

DETAILED DESCRIPTION OF THE DRAWINGS

A typical example of the desirability of compression is the use of matrix representations and linear algebra operators to simulate reality on a 2-dimensional screen in computer graphics and related applications. Operations on a source data matrix often consist of rotations and other transformations, and often sequences of them, of the type shown in FIG. 2. As can be seen these matrices contain a large number of zeroes which require a large amount of memory bandwidth to load/store while not contributing to the result of the calculations performed using the whole matrix, i.e. they are trivial values from the point of view of arithmetic.

Figure 1:
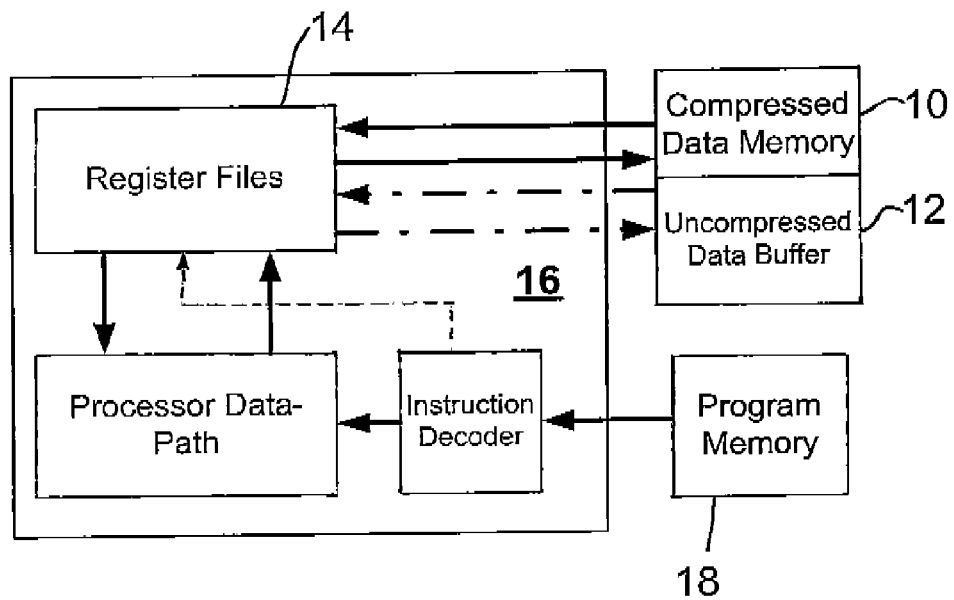
FIG. 1 is a processor arrangement known in the art.
Figure 3:
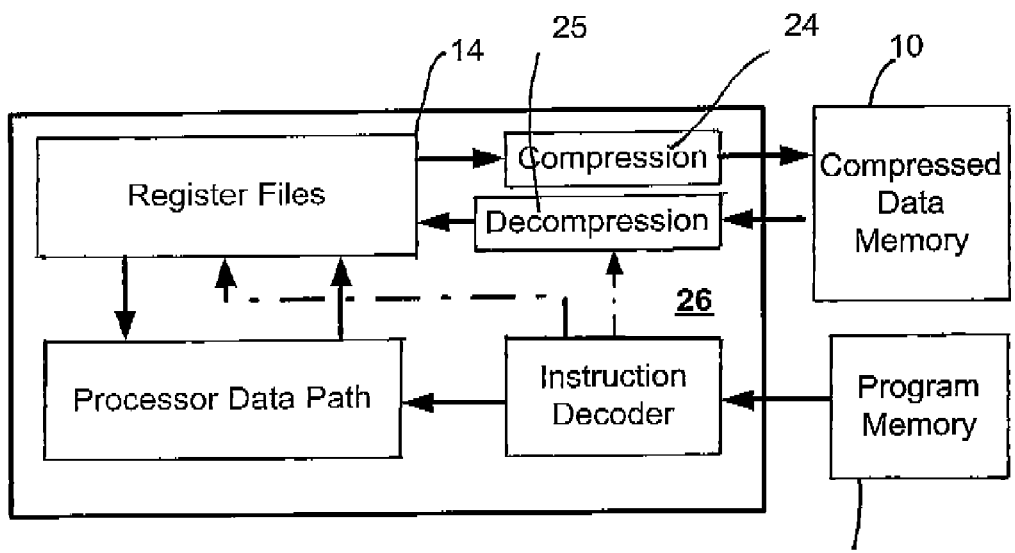
FIG. 3 is an exemplary processor according to an embodiment of this application.

The present application, shown in FIG. 3, provides a modified processor which is capable of operating directly upon compressed data in memory without the requirement for decompression processing, thus eliminating the requirement for an additional uncompressed data buffer and additional processor and memory bandwidth required to handle decompression of compressed data into a buffer area for further processing. Instead, the compression and decompression processes are integrated in the memory access structures of the processor.

The application allows compressed structures of arbitrary size and complexity, consisting, for example but not limited to, any combination of the following: floating-point matrices, floating-point vectors, floating-point scalars, signed integers, unsigned integers, packed characters and address-pointers.

Suitably, the compression and decompression logic is embedded within the processor load/store ports, making the programmer's job easier in terms of not having to worry about the details of how data is read/written from/to the compressed memory subsystem on a transaction by transaction basis.

The solution described herein employs a value map to code for zero and nonzero entries in dense sub-matrix in the manner shown in FIG. 4. The use of such a value map has been described previously in related applications (U.S. 60/911,273 filed 11, Apr. 2007, U.S. 60/911,274 filed 11, Apr. 2007 and UK 0704999.2 and UK0704976.0 and corresponding PCT applications claiming priority therefrom) the entire contents of which are incorporated herein by reference. In the example shown a compression of 37.5% is achieved. The proposed solution has the advantage that each zero entry in the matrix to be stored is represented by a 1-bit rather than a 32-bit single 15 precision, 64-bit double-precision, etc. number. Overall compression is achieved as long as 1 or more entries per dense-matrix are zero in a 32-bit memory system storing a sparse matrix with 32-bit single-precision entries.

While the basic compression method outlined above is interesting and offers advantages, in most practical applications the programmer desires to store more than just sparse matrices and often needs to store and retrieve data stored in complex data-structures. The challenge is how to integrate a compression scheme so that it can provide similar performance and memory compression benefits to those outlined previously when handling mixed compressed/uncompressed data-structures without overly burdening the programmer.

The present application provides a means of random accessing data within a larger structure which may be compressed in the manner described previously, but may also contain uncompressed floating-point or integer data. The scheme allows a basic structure containing up to thirty-two 32-bit entries to be represented by a 32-bit integer (value map). In principle, the scheme is not limited to 32 but values or structures with 32 entries and the size of the value map and the number of entries may be selected to meet the requirements of the processor design. The presence of a 1-bit in the value map indicates the presence of a non-trivial floating-point or integer value at that position in memory as before. As each value is represented by a single bit, the value map may be referred to also as a bit map. An example of how a mixed (compressed/uncompressed) structure would be stored in memory is shown in FIG. 5.

The basic principle of operation of the proposed compressed structure decompression logic is that a value map is used to represent the presence of trivial values. For the purposes of this application a trivial value is a 0.0 single precision (32-bit) floating-point value (Hex 00000000), however the same scheme may easily be extended to double-precision floating-point or beyond. Alternately if there were a preponderance of some other value than 0.0 in a particular data-set the scheme outlined here could easily be extended to allow a value map 0 represent that value rather than 0.0, for instance some data sets might contain many 1.0 values.

Figure 5:
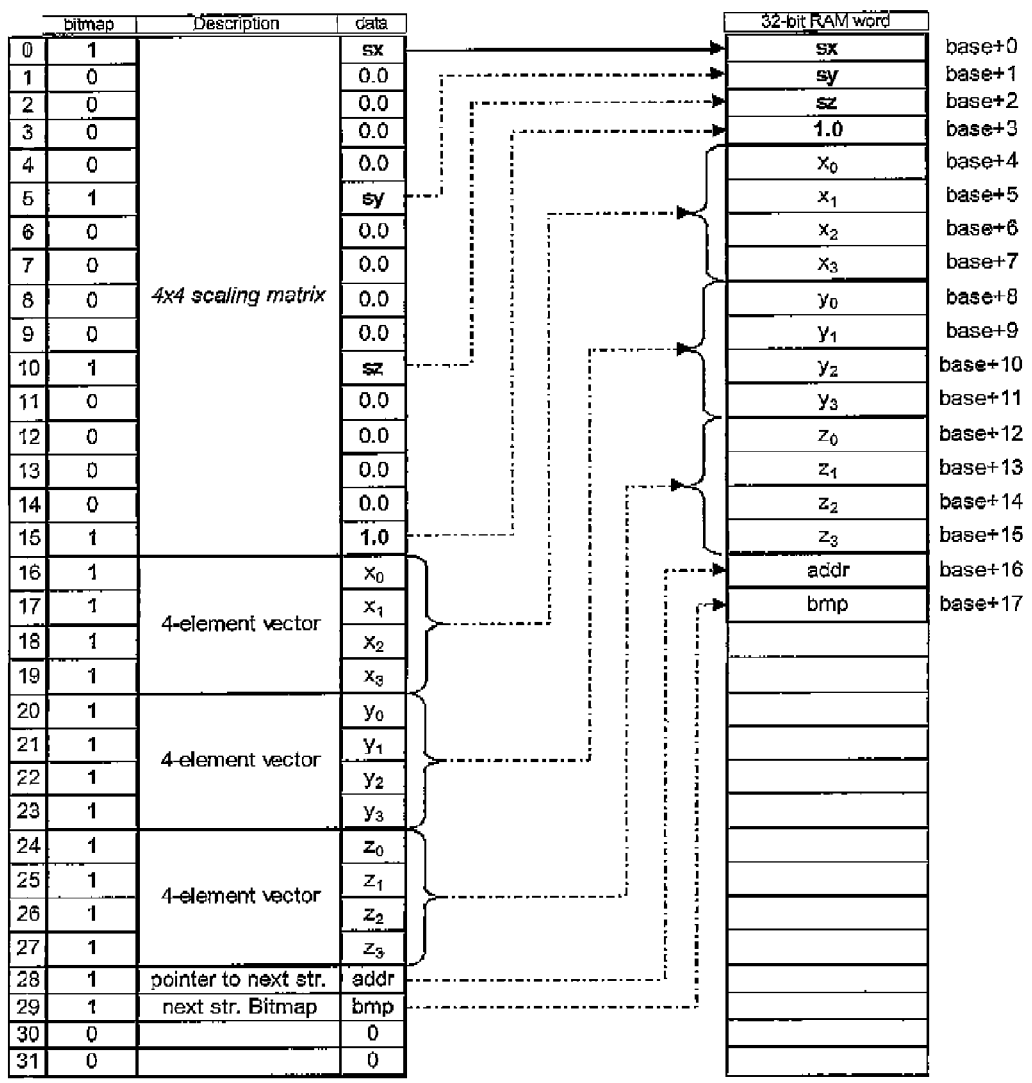
FIG. 5 illustrates how a memory structure can be compressed to fit in 32 bit RAM by the processor of FIG. 3.

As can be seen from the RAM addresses, for an exemplary arrangement of data, in FIG. 5 it can be seen that for each non-zero entry (sx, sy, sz, x0-x3, y0-y3, z0-z3) in the 32-bit value map an offset of 1 is added to the base address. In practice both the value map and the base address of the next structure in memory may be embedded in the current structure and retrieved by the programmer.

To make use of compressed structures it is beneficial to reduce the overhead for the programmer in storing and retrieving the data stored in compressed form. In the present application, the programming overhead is minimised by hiding the complication of storing and retrieving compressed data inside the Load-Store Unit (LSU) address-generators of the processor which may for example be a RISC processor. The address generators allow a programmer to specify which elements of data are to be retrieved from a compressed structure. In turn, the LSU is able to retrieve the requested elements from the compressed structure in memory without decompressing the entire compressed structure.

Figure 6:
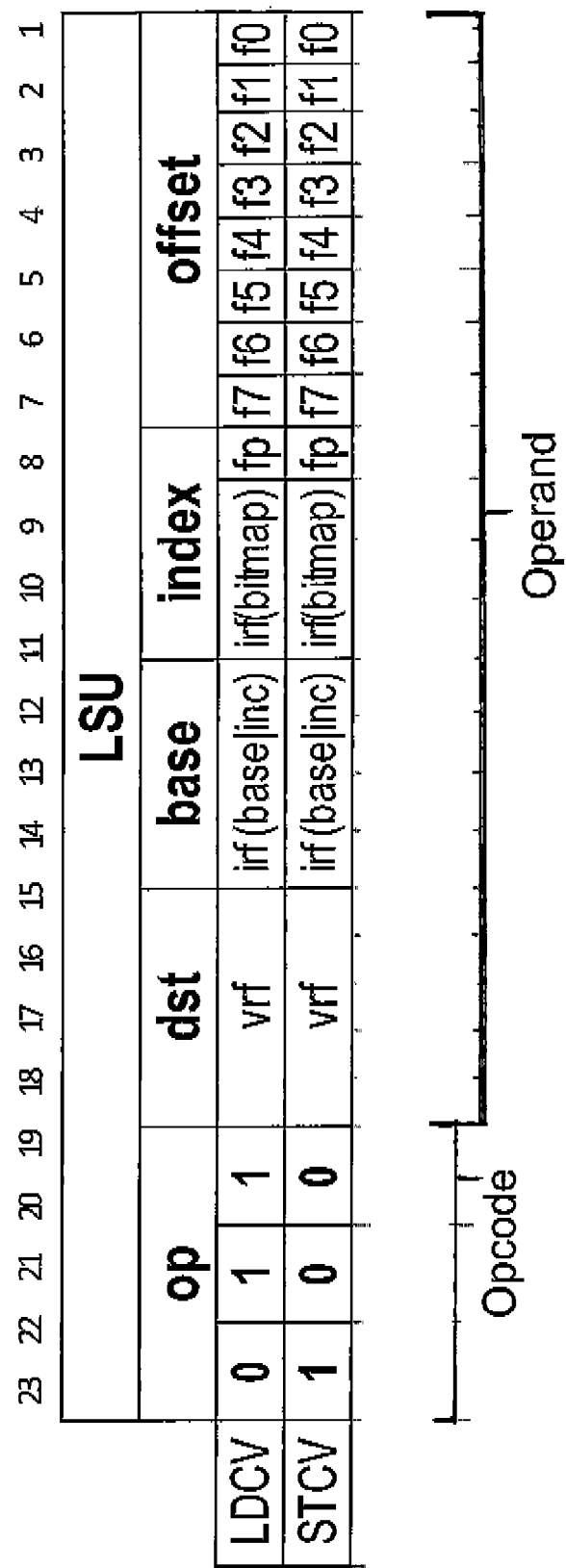
FIG. 6 illustrates the format of exemplary instruction codes that may be employed by the processor of FIG. 3.

Thus in the exemplary arrangement described herein, the address generators allow the programmer to specify which of 8 possible 4-entry fields (vectors) from a 32-entry compressed structure are to be loaded/stored using a simple 8-bit field mask which is included in the load/store opcode as shown in FIG. 6. In the exemplary arrangement described herein, the instruction for loading a compressed vector is LDCV, whereas the instruction for storing a compressed vector is STCV.

This exemplary arrangement allows a programmer to specify the 4-entry vector register file (VRF) register to which data will be loaded/stored from/to. The base register in the integer register file (IRF) to which the addressgenerator will add the compressed-structure offset and the value map register also in the IRF. The opcode then contains an immediate 8-bit value f[7:0] which is used to select which of the eight four-entry compressed vectors actually get loaded/stored from/to the VRF.

Figure 7:
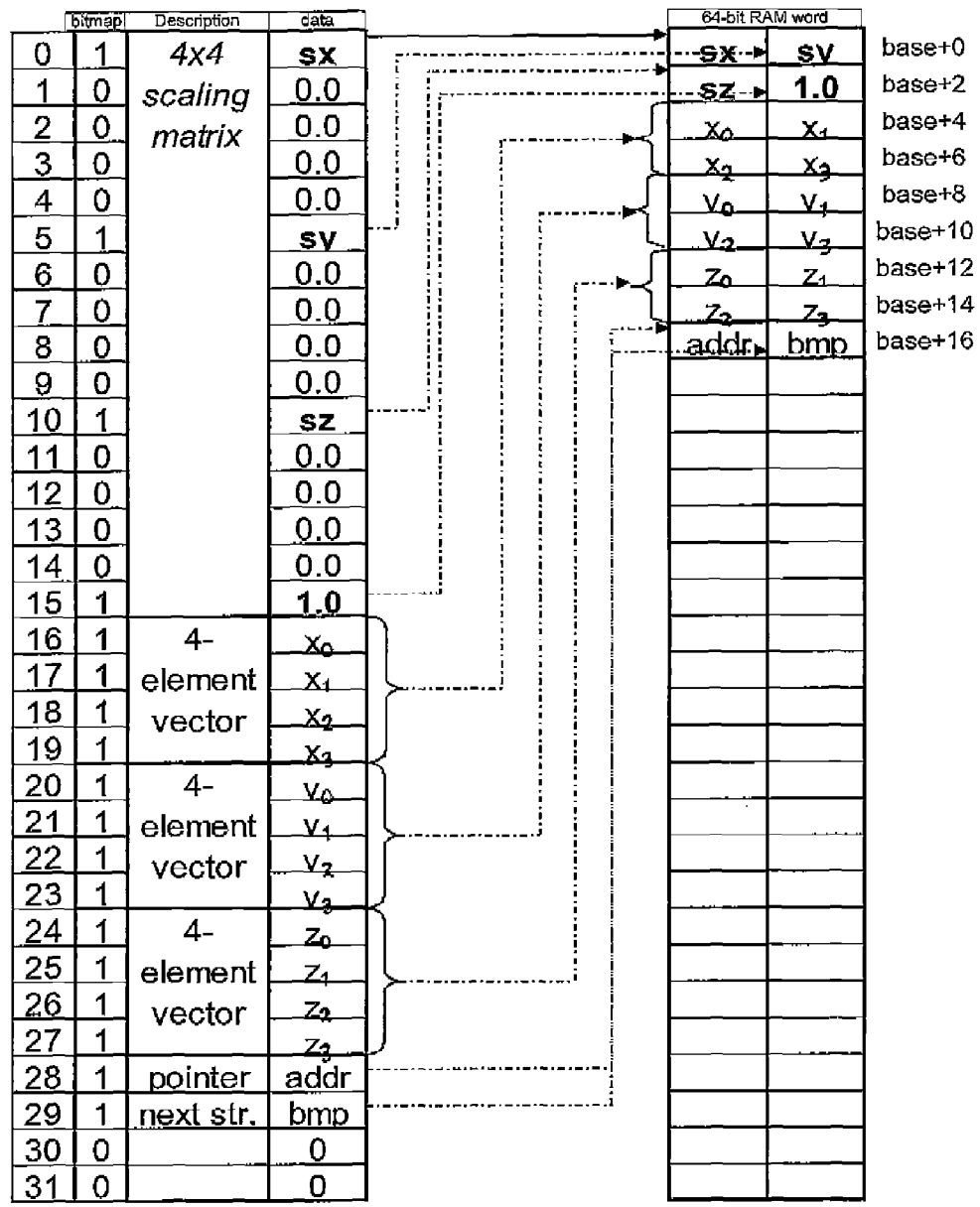
FIG. 7 illustrates how the same memory structure of FIG. 5 can be compressed to fit in 64 bit RAM by the processor of FIG. 3.

As the LSU port-width is generally limited, in the case of exemplary arrangement in this application to 64-bits, it will be appreciated that the LDCV and STCV instructions necessarily take multiple clock-cycles. As a result the value map is decoded in an iterative fashion in the order of the f-bits causing a 64-bit compressed entry to be written to or read from the correct VRF register and stored to or read from the correct memory (RAM) address as seen from the LSU port. The layout in RAM of a typical compressed structure in a 64-bit memory subsystem is as shown in FIG. 7.

It will be appreciated that the method and arrangement is not limited to 32 bit words or 64 bit wide memories and that similar layouts are possible for other memory widths including 96 and 128-bit wide memories etc, however for simplicity of explanation such arrangements organisations will not be discussed in detail here.

The VRF may be used as a staging area for the complete compressed structure before parts of it are dispersed to other register files internal to the processor in the case of a compressed load, or alternately for the storing of a compressed structure to external RAM attached to the LSU port.

Figure 8:
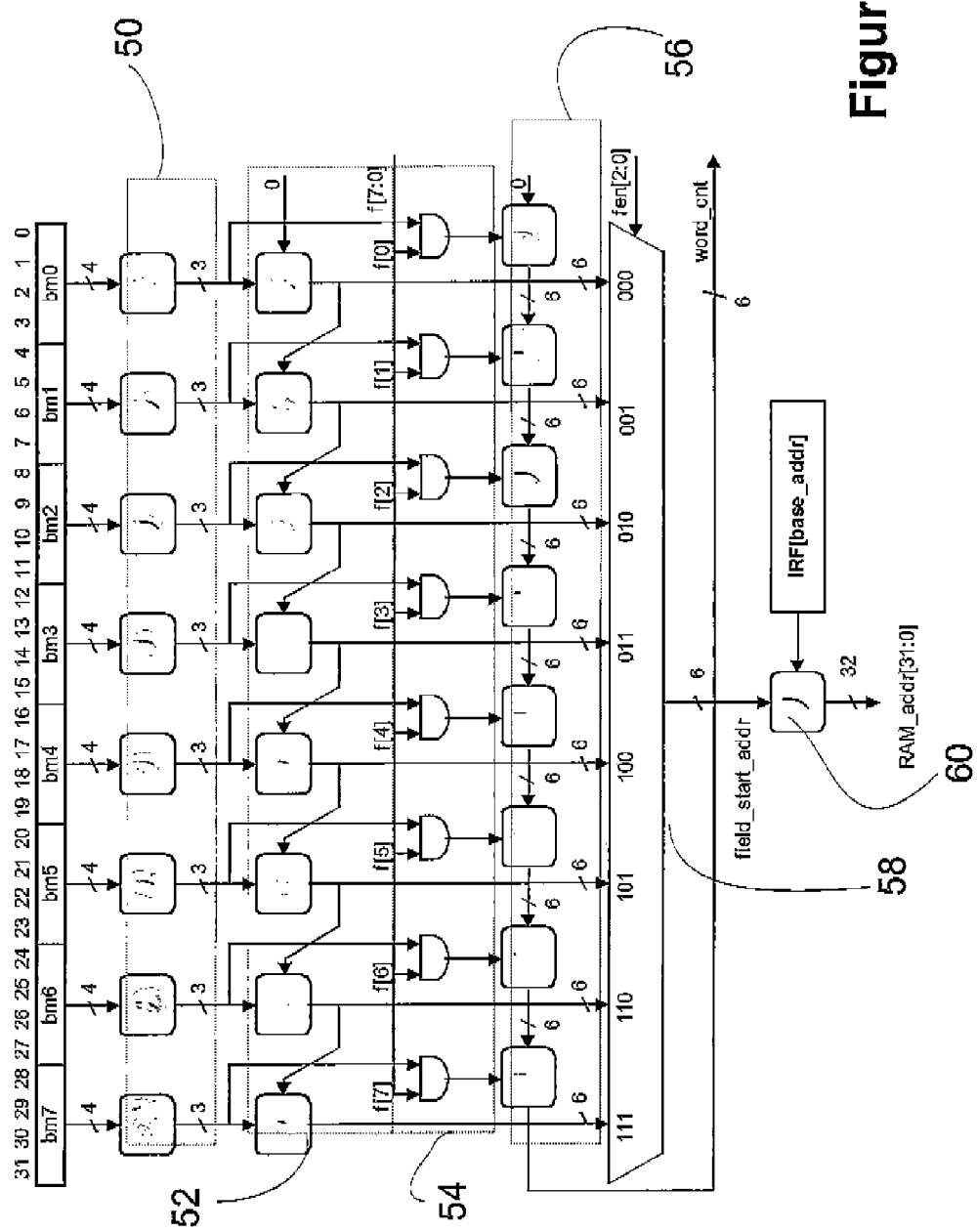
FIG. 8 is an exemplary circuit for generating addresses which might be employed by the processor of FIG. 3, FIG. 9 demonstrates the operation of FIG. 8 with exemplary values, FIG. 10 demonstrates exemplary load\store circuit that might be employed in the processor of FIG. 3.

An exemplary logic for the LSU will now be discussed with reference to FIG. 8, which shows the logic for the LSU compressed-structure address generator for loading values from within a compressed structure at a given base address (base_addr). A first row of adders 50 (compressors) is provided to compress the value map structure of 32 bits arranged in eight 4-bit value map fields (bm7-bm0) into eight 3-bit numbers, each of which represents the number of ones in a given 4-bit value map. A second row of adders 52 is provided to add the results of the row of compressors to generate the start address of each value map so that each value map field may be addressed independently if required by applying the appropriate f-bits in the compressed load or store opcode. A row of AND gates 54 is provided to mask out unrequired fields depending on the state of the f (field) bits set in the compressed load/store opcode. The outputs of these AND gates are then summed by a further set of adders 56 to generate the total number of 32-bit words (word_cnt) which must be loaded/stored from/to memory based on the opcode f-bits. A final 8:1 multiplexer stage 58 is controlled by an 8 field-enable which allows the required value map addresses selected to be applied sequentially to a final adder 60 in order to generate the required RAM addresses.

Figure 9:
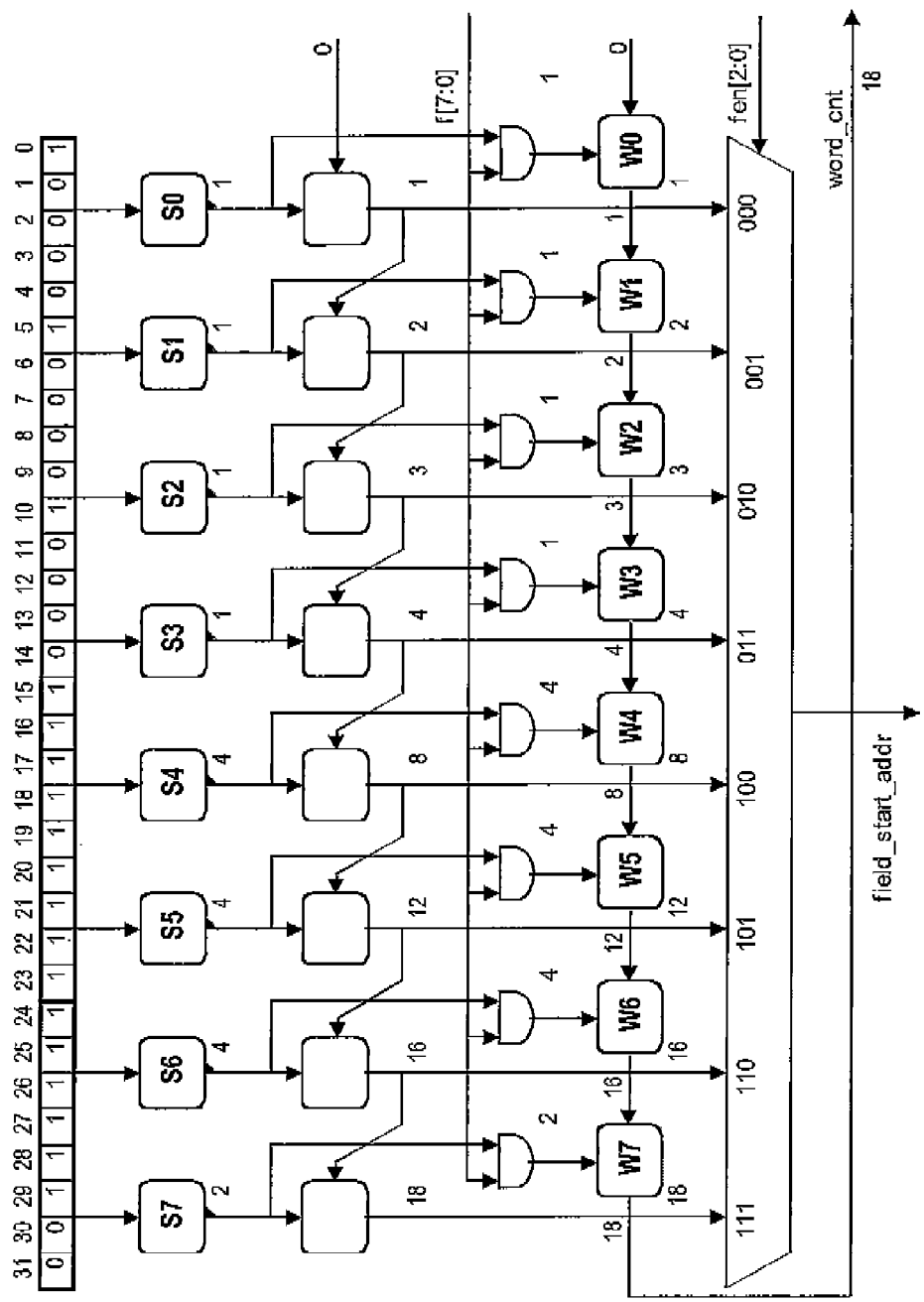

The values of the various signals for the example compressed data structure are shown in FIG. 9. The addresses shown are calculated statically from the value map in the selected IRF (Integer Register File) register and are then applied sequentially depending on the stage of the f-bits specified in the compressed load or store instructions.

Figure 10:
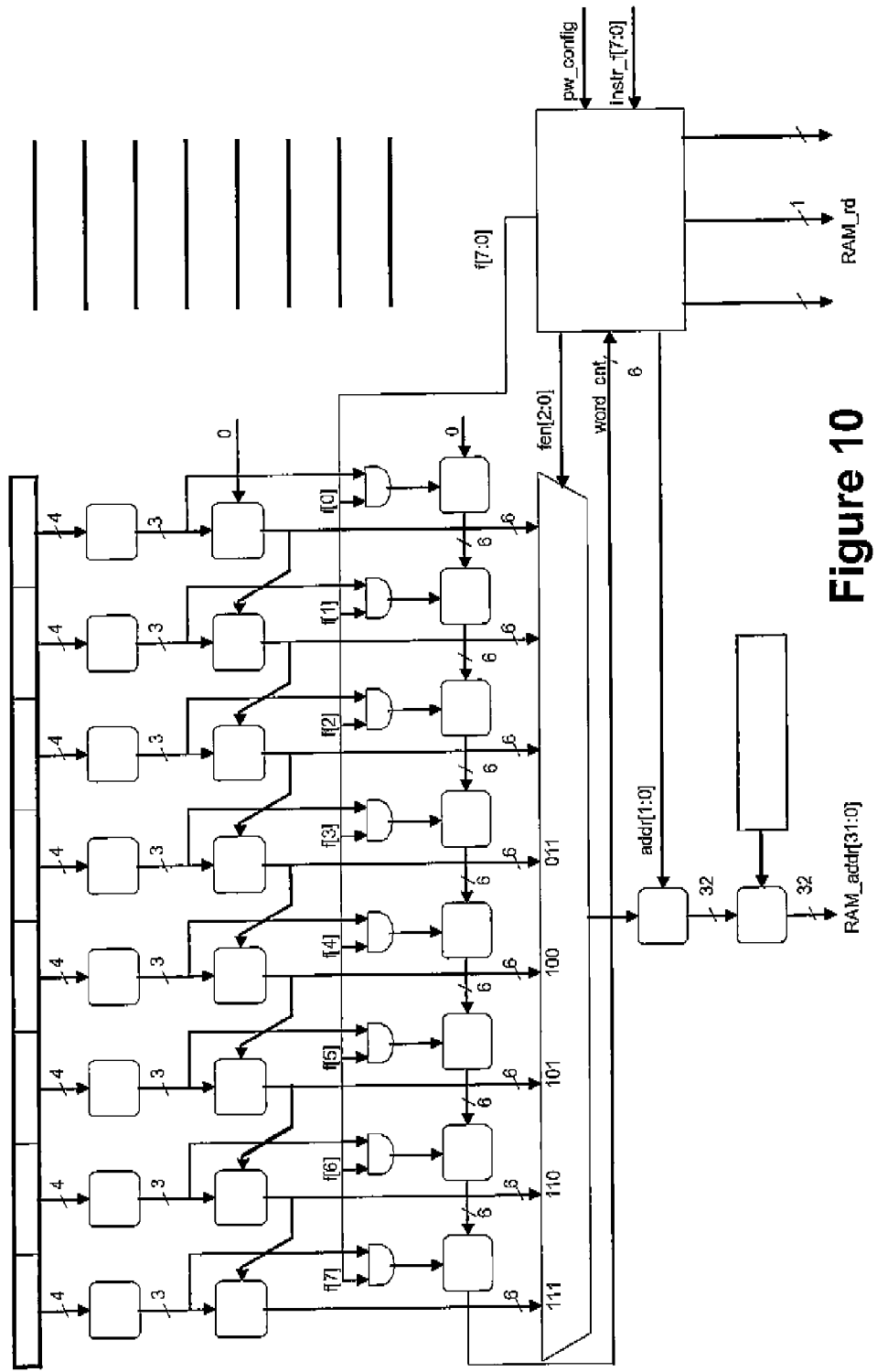

The complete address-generation logic for the compressed load/store operations including the counter and finite-state machine to generate the required control signals is shown in FIG. 10.

The fen[2:0] signal which selects the sequence of addresses to be applied to the address selection multiplexer operates according to the truth-table shown in FIG. 11.

Figure 12:
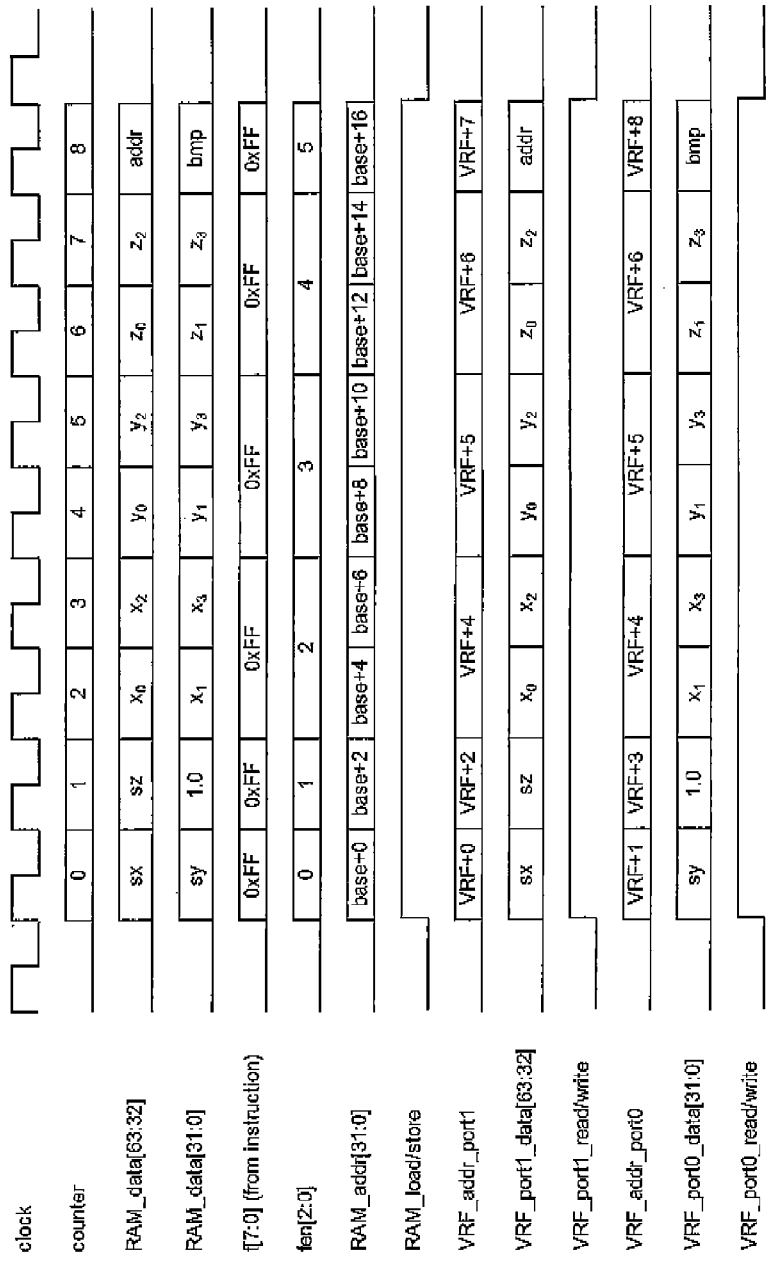
FIG. 12 is an exemplary timing diagram illustrating the mode of operation of the circuit of FIG. 10

As may be seen in FIG. 12 not only are the source/destination addresses required for the compressed load/store operations generated by the LSU address-generator, but the source/destination addresses for the source/destination VRF rows relative to that specified in the compressed load/store operation are also generated. In the case of a 64-bit LSU bus up to 2 VRF rows may be addressed in a compressed load/store instruction. Although in the present exemplary arrangement, the VRF was chosen as the source/destination for data loaded or stored in compressed load/store operations, in principle the Integer Register File (IRF) or scalar register file (SRF) could equally have been chosen.

The exemplary timing diagram of FIG. 12 shows clearly that the compressed load/store operation takes multiple cycles to execute and all of the required control signals are generated from knowledge of the IRF value map descriptor for the compressed structure coupled with the f-bits specified in the compressed load/store control word. The sequence of control signals is derived using the f-bits and value map in conjunction with a counter which is driven by the clock input to the address-generator.

The diagram shows behaviour for both the load and store operations, the only difference between the 2 operations would be:

1. In the case of a compressed load a read signal is generated to read from the RAM attached to the LSU port and a write signal is generated for the appropriate VRF row which acts as a destination for the RAM contents. In fact a series of RAM reads and VRF writes may be generated depending on the state of the value map in the IRF and the f-bits set in the compressed load opcode.
2. Similarly in the case of a compressed store a series of VRF reads and RAM writes may be generated depending on the state of the IRF value map and the f-bits set in the compressed store opcode.

Figure 13:
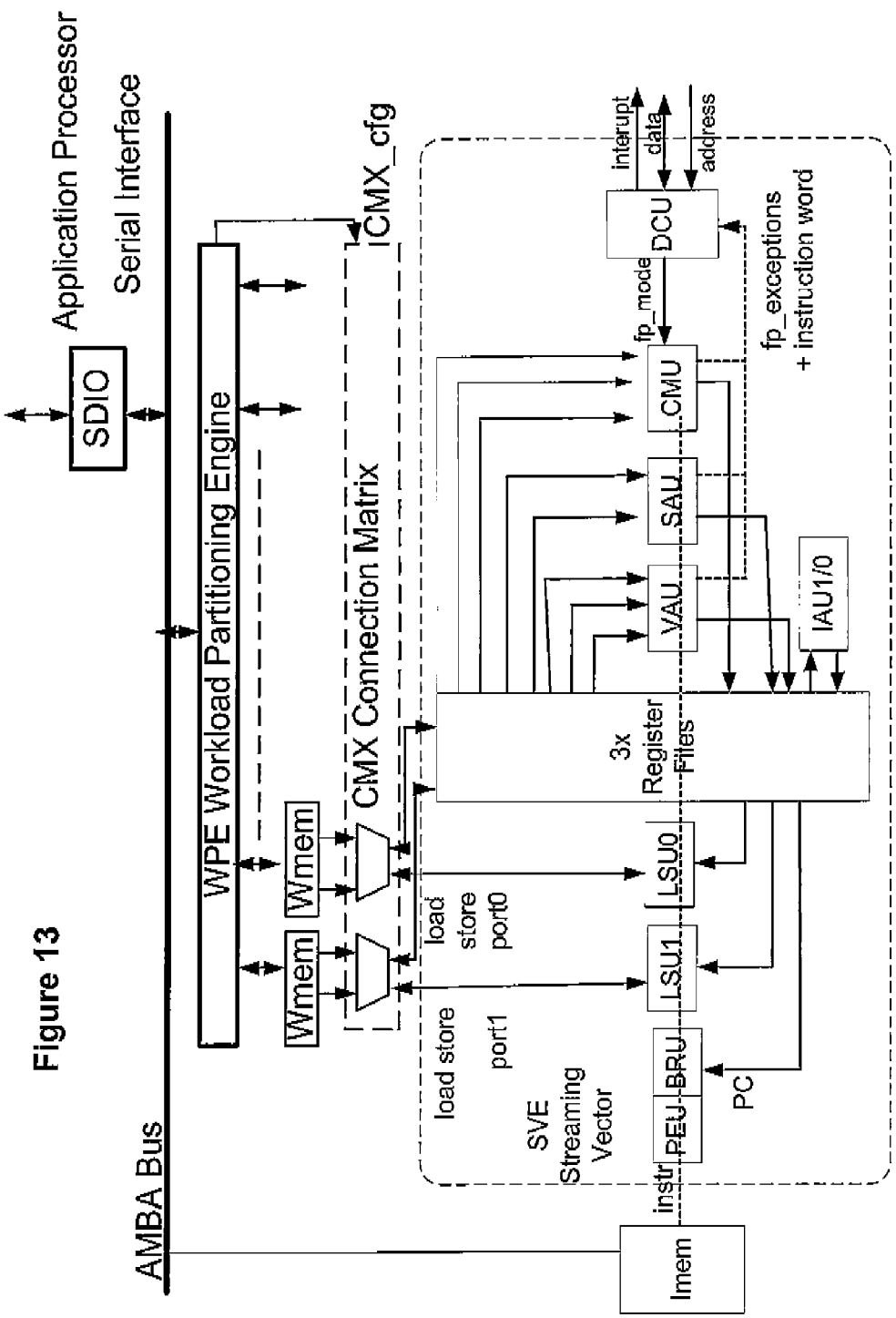
FIG. 13 is a more detailed block diagram of the processor of FIG. 3.

A block-diagram of the SVU architecture, of which the Load Store Unit (LSU) with compressed load/store operations forms a part, is shown in FIG. 13. As can be seen the principal external interfaces are to the SVU instruction memory, and the LSU ports which connect to the data memory-banks as well as the debug control unit (DCU)

which allows SVU registers and diagnostic information to be read/written via the processor bus.

The instruction word has 7 slots which allow it to control up to 7 of the 9 functional units per cycle as shown in FIG. 14.

In the present exemplary embodiment, the leftmost bit of the 128-bit instructions is reserved to provide for future features and the remaining 127 bits are split into fields, each of which controls one of up to 9 functional units contained in the preferred embodiment of processor architecture:
1× Predicated Execution Unit (PEU)
1× Branch/Repeat Unit (BRU)
2× Load-Store Units (LSU)
1× Vector Arithmetic Unit (VAU) • 1× Scalar Arithmetic Unit (SAU)
2× Integer Arithmetic Units (IAU)
1× Compare/Move Unit (CMU)

A final functional unit not under the direct control of the instruction-word is the Debug Control-Unit (DCU) which allows the processor to monitor and control program execution, especially in the event that exceptional conditions and/or interrupts occur.

The exemplary LSU allows vector data to be loaded from memory into VRF registers by the programmer. The LSU is controlled by a 24-bit opcode and can perform one of 8 operations:
NOP i.e. not load any data from memory (clocks gated off for power-saving)
LDVX load 4-element uncompressed vector from memory
STVX store 4-element uncompressed vector to memory
LDCV load 4-element compressed vector from memory
STCV store 4-element compressed vector to memory •
LDLI load 16-bit immediate into lower 16-bits of specified IRF register
LDHI load 16-bit immediate into upper 16-bits of specified IRF register
CPXI copy size/address of field 1-8 in IRF value map to IRF base register An exemplary opcode table for the LSU is shown in FIG. 15.

Figure 16:
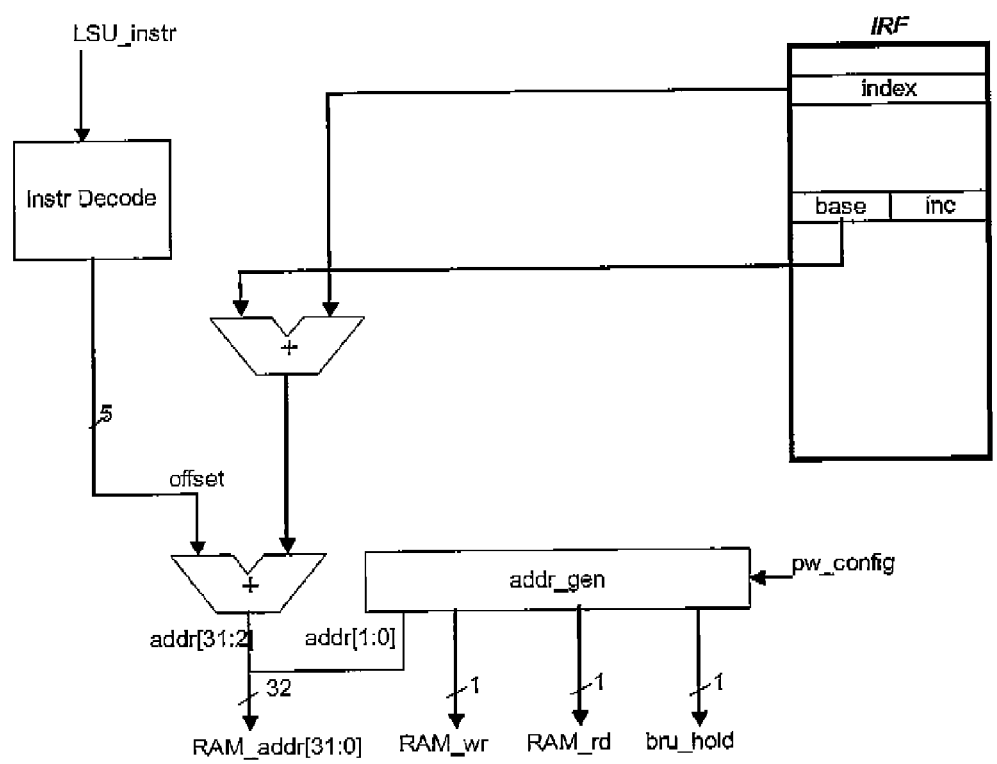
FIG. 16 is a circuit for address generation for a non compression based instruction.

A block diagram of the LSU in uncompressed load/store mode is shown in FIG. 16. In this mode, the bru_hold signal prevents the program-counter (PC) in the BRU from advancing until the load/store operation has been completed. This is important where loads and stores do not complete in a single cycle because the 4 vector elements must be transferred in 1 s or 2 s rather than 4 elements in a single cycle (128-bits).

Figure 17:
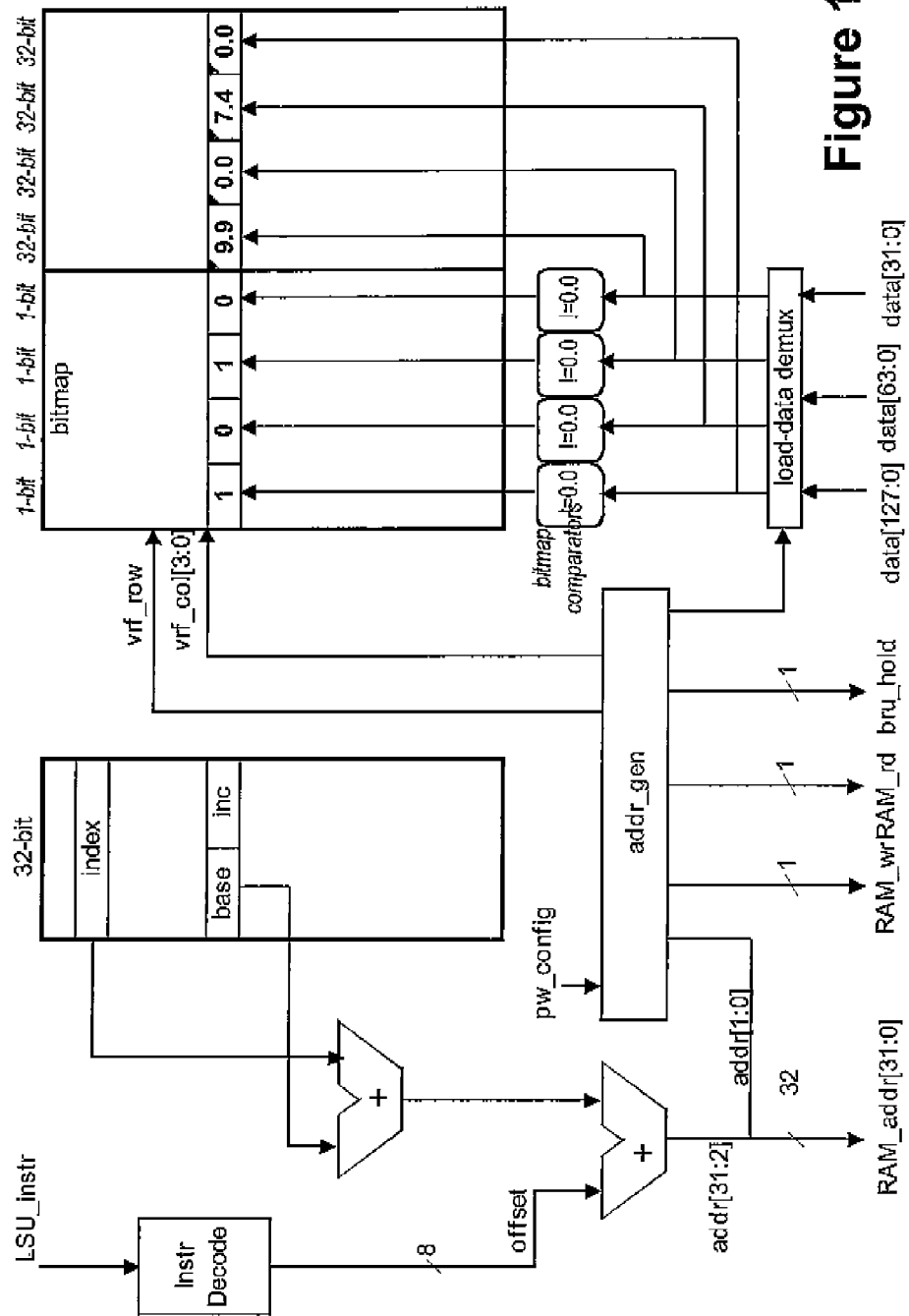
FIG. 17 is circuit for generating a bit as employed by the compression method of the processor.

The block-diagram of the value map generation logic and load/store path to the VRF is shown in FIG. 17 for Non-Zero Value map Generation. Whenever an uncompressed 4-element vector is loaded from memory into the VRF an additional 4-entry non-zero value map is generated using a row of 4 comparators (4×32-input NOR gates) and inserted on the corresponding VRF row as the data fetched from memory. This 4-bit value map entry may be used later to store data back to memory in compressed format and to minimise power dissipation by eliminating trivial operations on zero values.

A unique capability of the processor architecture described herein is its support for the loading and storing of compressed data in a random access manner without requiring the entire compressed structure to be retrieved. The reason for this support is that many interesting applications operate on large bodies of sparse data i.e. the data contains large numbers of zeroes which have to be fetched from memory and when operated upon generate zero results.

The main assumptions in the architecture are that all data to be handled by the processor is packed into 4-element vectors to be stored in memory, whether this data is compressed or uncompressed, and whether the data consists of matrices, vectors and packed scalars or integers. Based on this assumption the programmer may organise matrix/vector/scalar/integer data into 32-entry compressed blocks where only those entries which are non-zero are explicitly stored. All zero values and non-zero values are represented by a 1-bit entry in a non-zero value map which can then be used to compress/uncompress the 32-entries into 32 or fewer, 32-bit words in RAM.

The transformation matrices used in 3D graphics and game physics (rigid body dynamics) applications shown in Figure are a good example. The 32-bit value maps corresponding to the 8 matrices are shown in detail in FIG. 2.

As can be seen in FIG. 18 graphics transformation matrices contain a large percentage of trivial (zero values) allowing over 50% data-compression to be achieved.

Figure 19:
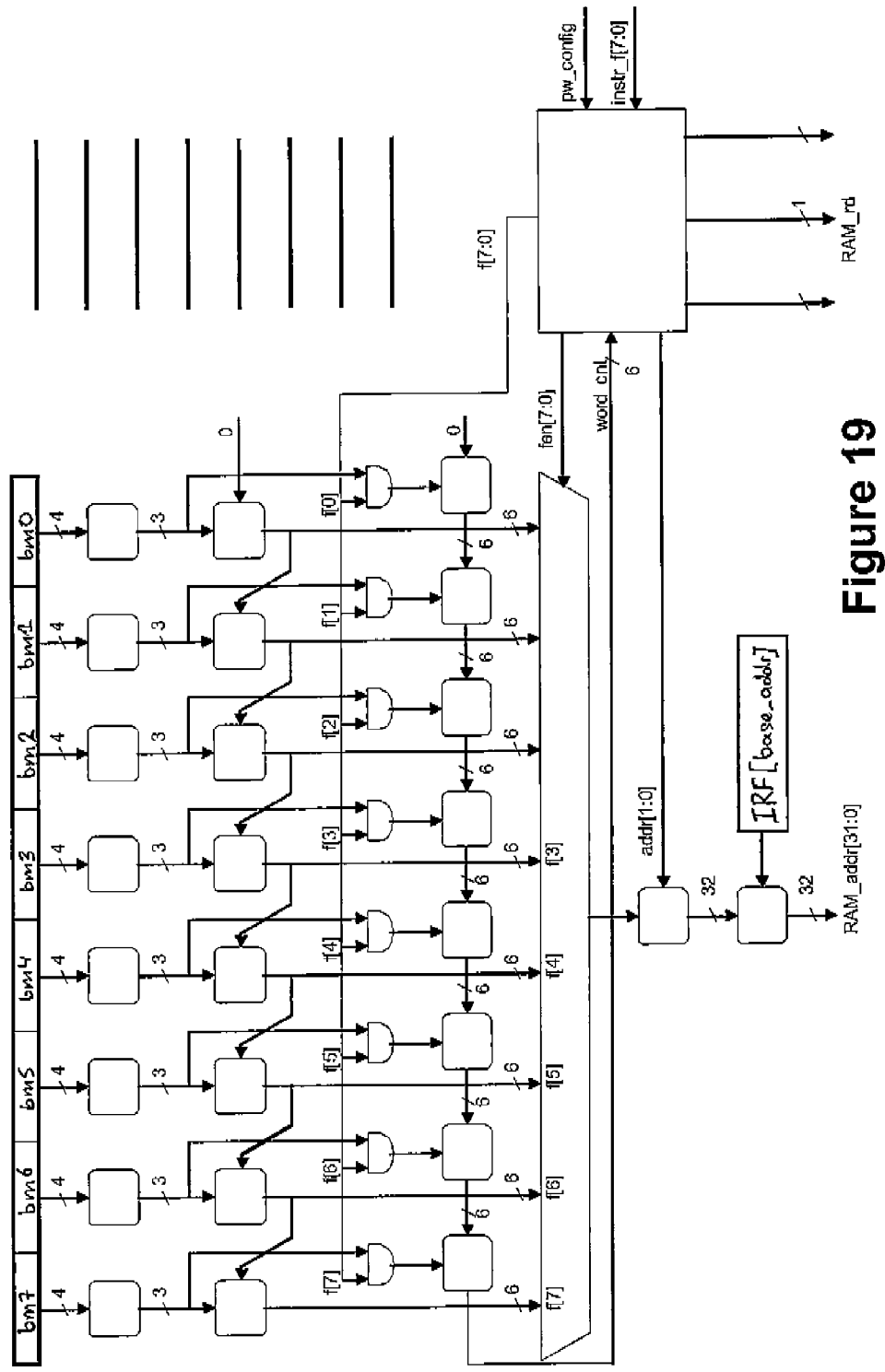
FIG. 19 is a circuit suitable for the processor of FIG. 2 for loading\storing compressed data.

The compression value maps are used to allow random-access into programmer defined complex data-structures using the hardware shown in FIG. 19. The compressed load operation allows the programmer to gather a series of up to 8×4-element values specified by an 8-bit field in the opcode from addresses beginning at the base address specified in the IRF. The hardware automatically generates the required addresses and read signals as well as generating a hold signal to hold the BRU in the case of multi-cycle loads being required, for example if more than 4 non-zeros must be loaded from memory. In contrast, in the prior art this type of complex scatter gather functionality is typically complex to achieve with traditional processor architectures requiring multiple registers to be set up with base addresses and offsets to allow the indexing of complex data-structures. Furthermore such traditional processor architectures make no provision for the compression of trivial data-values.

Suitably, the LSU port widths are configurable independently via the SVU_LCR register detailed in section 6. The port width parameter allows top level SoC interconnect to be traded off against the throughput of the SVU by allowing 4-element vectors to be loaded/stored in multiple transactions over a /2/4 element wide data bus attached to the SVU LSU ports as shown in FIG. 20.

The generation of the additional address lsbs to support the port-width parameterisation is performed using a counter which appends 0, 1 or 2 address lsbs to the address generated by the LSU as shown in FIG. 21.

Figure 22:
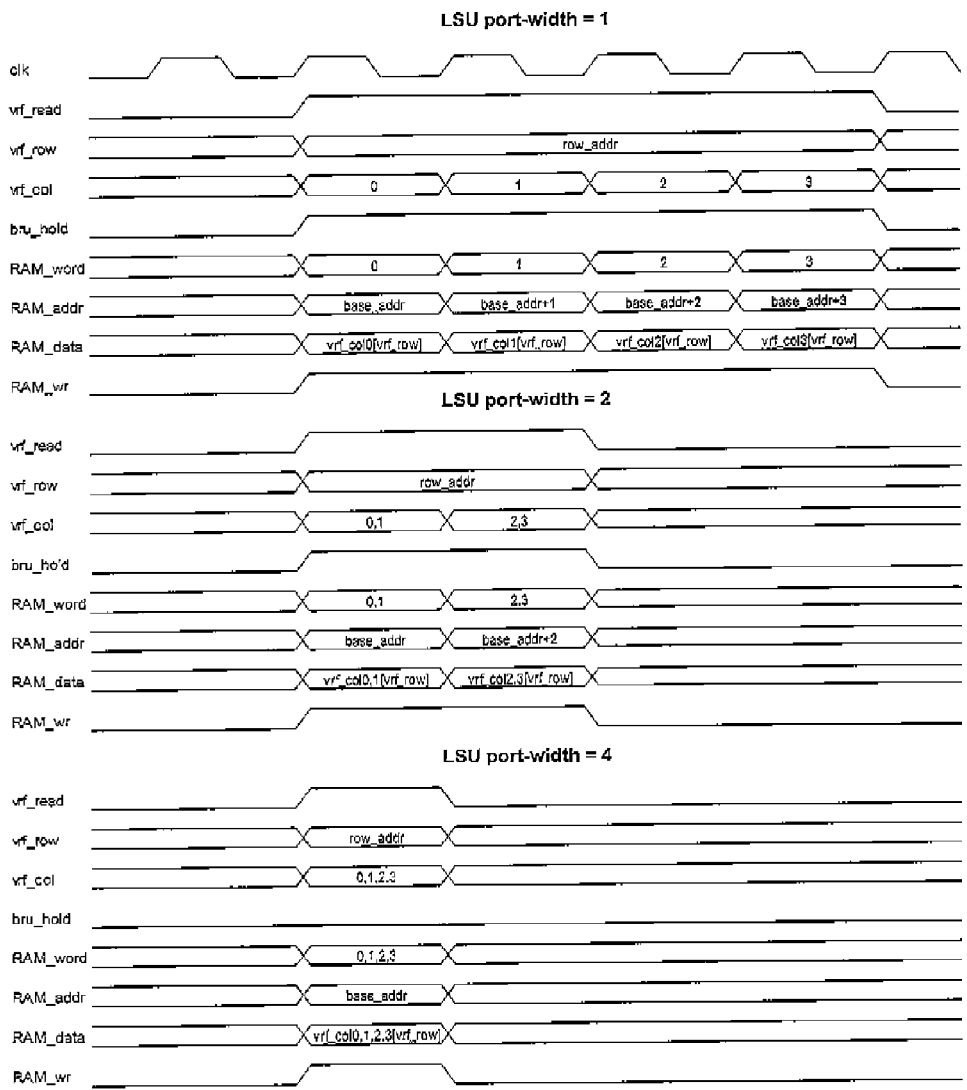
FIG. 22 is exemplary timing diagrams illustrating the effects of FIG. 20.

The effect of the port-width parameter on a 4-element store to SVU RAM is shown in FIG. 22. As can be seen in FIG. 18 graphics transformation matrices contain a large percentage of trivial (zero values) allowing over 50% data-compression to be achieved.

The compression value maps are used to allow random-access into programmer defined complex data-structures using the hardware shown in FIG. 19. The compressed load operation allows the programmer to gather a series of up to 8×4-element values specified by an 8-bit field in the opcode from addresses beginning at the base address specified in the IRF. The hardware automatically generates the required addresses and read signals as well as generating a hold signal to hold the BRU in the case of multi-cycle loads being required, for example if more than 4 non-zeros must be loaded from memory. In contrast, in the prior art this type of complex scatter gather functionality is typically complex to achieve with traditional processor architectures requiring multiple registers to be set up with base addresses and offsets to allow the indexing of complex data-structures. Furthermore such traditional processor architectures make no provision for the compression of trivial data-values.

Suitably, the LSU port widths are configurable independently, for example, by means of a parameter provided as an entry in a register. The port width parameter allows top-level SoC interconnect to be traded off against the throughput of the SVU by allowing 4-element vectors to be loaded/stored in multiple transactions over a 1/2/4 element wide data bus attached to the SVU LSU ports as shown in FIG. 20.

The generation of the additional address lsbs to support the port-width parameterisation is performed using a counter which appends 0, 1 or 2 address lsbs to the address generated by the LSU as shown in FIG. 21.

The effect of the port-width parameter on a 4-element store to SVU RAM is shown in FIG. 22. As can be seen the number of cycles taken to load or store a 128-bit vector takes 4 cycles when port width is 1 (32-bits), 2 cycles when the port width is 2 (64-bits) and 1 cycle when the port width is 4 (128-bits).

Although the present application has been described with respect to a processor with an instruction set having an identified opcode for performing the data transfer between the memory and the processor, it will be appreciated that the function may be performed where there is no explicit instruction-set in program storage, but rather loads and stores are performed under the control of a state-machine or other means. A significant advantage is that one or more items of data may be retrieved from a compressed structure in memory without having to retrieve or decompress the entire compressed structure. Similarly, a single item of data may be updated in a compressed structure stored in memory without having to retrieve or decompress the entire compressed structure.

The words comprises/comprising when used in this specification are to specify the presence of stated features, integers, steps or components but does not preclude the presence or addition of one or more other features, integers, steps, components or groups thereof.

The invention claimed is:

1. A processor comprising:
an instruction set architecture, the instruction set architecture including at least one load instruction to retrieve an individual data value from a compressed data structure, the compressed data structure including a plurality of data values including the individual data value, the plurality of data values stored in random access memory, the at least one load instruction to retrieve the individual data value from the compressed data structure without retrieving all of the plurality of data values, the individual data value is a floating point number or an integer, the at least one load instruction including an opcode and at least one operand identifying the position of the individual data value in a non-compressed form of the data structure, wherein the processor converts the position of the individual data value in the non-compressed form into a memory location for the individual data value within the compressed data structure and retrieves the individual data value from the compressed data structure without decompressing other data values of the plurality of data values in the compressed data structure,
wherein the non-compressed form of the data structure includes zero and non-zero data values and the compressed data structure only includes non-zero data values and a map representing the locations of non-zero data values in the non-compressed form of the structure.

2. A processor according to claim 1, wherein the processor is configured to obtain the map of the compressed data structure prior to transferring the requested data value.

3. A processor according to claim 2, wherein the processor determines from the map whether the requested data value is a zero or non-zero data value.

4. A processor according to claim 3, wherein the at least one operand includes a base address for the compressed structure in memory.

5. A processor according to claim 4, wherein in the event that the processor determines from the map that the requested data value is a non-zero data value, the processor is configured to:
count, from the map, how many data values preceding the requested data value in the map are non-zero data values and provide a number indicating how many non-zero values were counted; and
add the number as an offset to the base address in advance of retrieving the requested data value from the compressed data structure.

6. A processor according to claim 5, wherein said count is implemented using a series of adders.

7. A processor according to claim 3, wherein in the event that the processor determines from the map that the requested value is a zero value, the processor is configured to return zero without accessing the memory.

8. A processor according to claim 1, wherein the processor is adapted to individually load two or more of the plurality of data values in response to the at least one load instruction without loading all of the plurality of data values.

9. A processor according to claim 1, further including decompression logic, responsive to the at least one load instruction, to determine the memory position from which to retrieve the individual data value based on the map, and wherein the decompression logic is integrated in memory access structures of the processor.

10. A processor according to claim 9, wherein the decompression logic is embedded in a load port of the processor.

11. A processor according to claim 1, wherein the compressed data structure includes up to thirty-two entries to store the plurality of data values.

12. A processor according to claim 11, wherein each of the up to thirty-two entries includes a 32-bit entry.

13. A method of respectively loading data values on a one-by-one basis from within a compressed data structure containing a plurality of data values into a processor without loading all of the plurality of data values from the compressed data structure, wherein a first data value to be loaded is a floating point number or an integer, and wherein the compressed data structure is stored in memory in a compressed form in which only non-zero data values are present, the compressed form further including a map specifying the locations of the non-zero data values in a non-compressed structure, the method of loading the first data value comprising:
receiving at least one operand identifying a position of the first data value in the non-compressed form of the compressed data structure,
using the map to identify a stored position of the first data value within the compressed structure, and
using the stored position to load the first data value from the compressed data structure in memory into the processor without decompressing other data values of the plurality of data values in the compressed data structure.

14. A method according to claim 13, wherein the method further includes obtaining the map of the compressed data structure prior to retrieving the first data value.

15. A method according to claim 14, wherein the obtaining of the map includes retrieving the map from the memory.

16. A method according to claim 14, further including determining from the map whether the first data value is a zero or non-zero value, wherein in the event that the first data value is a non-zero value, the method further includes:
   counting, from the map, how many data values preceding the first data value are non-zero values and providing a number indicating how many non-zero values were counted; and
   adding the number as an offset to a base address for the memory in advance of loading the first data value from the memory.

17. A method according to claim 13, wherein the method further includes transferring a multiple of data values at a time between the processor and memory.

18. A method according to claim 14, further including determining from the map whether the first data value is a zero or non-zero value, wherein in the event that the first data value is the zero value, returning zero directly to the processor without accessing the memory.

19. A data processing machine comprising:
   a data transfer feature to load a single one of a set of data values from a compressed data structure in memory, wherein the single one of the set of data values is a floating point number or an integer, the compressed data structure including the set of data values in which only non-zero data values are present and a map identifying the locations of the non-zero data values in an equivalent non-compressed data structure, the data transfer feature being responsive to an instruction to load the single one of the set of data values, the instruction identifying the position of the single one of the set of data values in the equivalent non-compressed data structure, the data transfer function to generate a memory offset from the identified position and to use the offset to transfer the single one of the set of data values from the compressed data structure in memory without decompressing other data values of the set of data values in the compressed data structure.

20. A processor comprising:
   an instruction set architecture, the instruction set architecture including at least one store instruction to individually store one data value from a non-compressed data structure of a plurality of data values into a corresponding compressed data structure in random access memory, wherein the one data value is a floating point number or an integer, the at least one store instruction including an opcode and at least one operand, the operand identifying the position of the one data value in the non-compressed data structure, wherein the processor converts the position of the one data value in non-compressed form into a memory location for the one data value within the compressed structure using a map showing the locations of each of the plurality of data values within the compressed data structure and individually overwrites the at least one data value at this memory location without overwriting other values of the compressed data structure in the random access memory.

21. A method of inserting an individual data value from a processor into a compressed structure including a plurality of data values in a memory in which only non-zero data values are present, wherein the individual data value is a floating point number or an integer, the compressed structure including a map identifying the locations of the non-zero data values in an equivalent non-compressed structure, the method comprising:
   identifying a position in the non-compressed structure of the individual data value to be inserted,
   using the map to identify from the position the equivalent position of the individual data value in the compressed structure, and
   storing the individual data value at the equivalent position in the compressed data structure without overwriting other data values in the compressed data structure.

22. A data processing machine comprising:
   having a data transfer feature to individually store a single data value directly into a compressed structure in memory, wherein the single data value is a floating point number or integer, the compressed structure including a plurality of data values in which only non-zero data values are present and further including a map identifying the locations of the non-zero data values in an equivalent non-compressed structure, the data transfer feature being responsive to an instruction to store the single data value without requiring storing additional ones of the plurality of data values, the instruction identifying a position of the single data value in the equivalent non-compressed structure, the data transfer function to generate a memory offset from the identified position and to use the offset to access the memory to individually store the single data value in the compressed data structure without overwriting other data values in the compressed data structure.

* * * * *

UNITED STATES PATENT AND TRADEMARK OFFICE
CERTIFICATE OF CORRECTION

PATENT NO. : 9,858,073 B2
APPLICATION NO. : 12/867095
DATED : January 2, 2018
INVENTOR(S) : David Maloney Page 1 of 1

It is certified that error appears in the above-identified patent and that said Letters Patent is hereby corrected as shown below:

In the Claims

Column 12, Line 33 (Claim 22): Remove the word "having" before "a data transfer feature"

Signed and Sealed this
Thirteenth Day of February, 2018

Andrei Iancu
*Director of the United States Patent and Trademark Office*